United States Patent
Schmid et al.

(10) Patent No.: US 7,547,398 B2
(45) Date of Patent: Jun. 16, 2009

(54) SELF-ALIGNED PROCESS FOR FABRICATING IMPRINT TEMPLATES CONTAINING VARIOUSLY ETCHED FEATURES

(75) Inventors: Gerard M. Schmid, Austin, TX (US); Nicholas A Stacey, Austin, TX (US); Douglas J. Resnick, Austin, TX (US); Ronald D. Voisin, Fremont, CA (US); Lawrence J. Myron, Allen, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 11/693,236

(22) Filed: Mar. 29, 2007

(65) Prior Publication Data
US 2007/0243655 A1  Oct. 18, 2007

Related U.S. Application Data

(60) Provisional application No. 60/792,750, filed on Apr. 18, 2006.

(51) Int. Cl.
*C03C 15/00* (2006.01)

(52) U.S. Cl. .............................. 216/83; 216/26; 216/67; 438/745

(58) Field of Classification Search .................. 216/83, 216/95, 26, 67; 438/745, 750, 7, 706, 710, 438/717
See application file for complete search history.

(56) References Cited

U.S. PATENT DOCUMENTS

| | | | |
|---|---|---|---|
| 3,503,538 A | 3/1970 | Barnes | |
| 4,022,855 A | 5/1977 | Hamblen | |
| 4,070,116 A | 1/1978 | Frosch et al. | |
| 4,208,240 A | 6/1980 | Latos | |
| 4,364,971 A | 12/1982 | Sack et al. | |
| 4,440,804 A | 4/1984 | Milgram | |
| 4,512,848 A | 4/1985 | Deckman et al. | |
| 4,521,445 A | 6/1985 | Nablo et al. | |
| 4,552,832 A | 11/1985 | Blume et al. | |
| 4,576,900 A | 3/1986 | Chiang | |

(Continued)

FOREIGN PATENT DOCUMENTS

EP   0398589   4/1998

(Continued)

OTHER PUBLICATIONS

Bien et al, "Characterization of masking materials for deep glass micromachining," Jan. 1, 2003, J. Micromech. Microeng. 13 pp. S34-S40.

(Continued)

*Primary Examiner*—Lan Vinh
(74) *Attorney, Agent, or Firm*—Laura C. Wood; Fish & Richardson P.C.

(57) ABSTRACT

A process that enables coplanarization of the structures that have been created in multiple independent etch steps. The various etches are performed independently by selectively exposing only certain patterns to particular etching conditions. After these structures have been created, it is possible that the various structures will exist at different planes/elevations relative to the template surface. The elevations of the various structures may be adjusted independently by selectively exposing "higher" structures to an anisotropic etch that reduces the overall elevation of the structures, while preserving the structural topography.

7 Claims, 4 Drawing Sheets

U.S. PATENT DOCUMENTS

| | | | |
|---|---|---|---|
| 4,637,904 A | 1/1987 | Rounds | |
| 4,676,868 A | 6/1987 | Riley et al. | |
| 4,707,218 A | 11/1987 | Giammarco et al. | |
| 4,731,155 A | 3/1988 | Napoli et al. | |
| 4,737,425 A | 4/1988 | Lin et al. | |
| 4,848,911 A | 7/1989 | Uchida et al. | |
| 4,857,477 A | 8/1989 | Kanamori | |
| 4,862,019 A | 8/1989 | Ashmore, Jr. | |
| 4,866,307 A | 9/1989 | Ashmore, Jr. | |
| 4,908,298 A | 3/1990 | Hefferon et al. | |
| 4,909,151 A | 3/1990 | Fukui et al. | |
| 4,919,748 A | 4/1990 | Bredbenner et al. | |
| 4,921,778 A | 5/1990 | Thackeray et al. | |
| 4,932,358 A | 6/1990 | Studley et al. | |
| 4,936,465 A | 6/1990 | Zold | |
| 4,957,663 A | 9/1990 | Zwiers et al. | |
| 4,959,252 A | 9/1990 | Bonnebat et al. | |
| 4,964,945 A | 10/1990 | Calhoun | |
| 4,980,316 A | 12/1990 | Huebner | |
| 5,003,062 A | 3/1991 | Yen | |
| 5,028,361 A | 7/1991 | Fujimoto | |
| 5,028,366 A | 7/1991 | Harakal et al. | |
| 5,053,318 A | 10/1991 | Gulla et al. | |
| 5,073,230 A | 12/1991 | Maracas et al. | |
| 5,110,514 A | 5/1992 | Soane | |
| 5,124,089 A | 6/1992 | Ohkoshi et al. | |
| 5,126,006 A | 6/1992 | Cronin et al. | |
| 5,148,037 A | 9/1992 | Suda et al. | |
| 5,151,754 A | 9/1992 | Ishibashi et al. | |
| 5,212,147 A | 5/1993 | Sheats | |
| 5,232,874 A | 8/1993 | Rhodes et al. | |
| 5,240,550 A | 8/1993 | Boehnke et al. | |
| 5,240,878 A | 8/1993 | Fitzsimmons et al. | |
| 5,244,818 A | 9/1993 | Jokerst et al. | |
| 5,246,880 A | 9/1993 | Reele et al. | |
| 5,250,472 A | 10/1993 | Chen et al. | |
| 5,259,926 A | 11/1993 | Kuwabara et al. | |
| 5,277,749 A | 1/1994 | Griffith et al. | |
| 5,288,436 A | 2/1994 | Liu et al. | |
| 5,324,683 A | 6/1994 | Fitch et al. | |
| 5,328,810 A | 7/1994 | Lowrey et al. | |
| 5,330,881 A | 7/1994 | Sidman et al. | |
| 5,348,616 A * | 9/1994 | Hartman et al. | 216/48 |
| 5,357,122 A | 10/1994 | Okubora et al. | |
| 5,362,606 A | 11/1994 | Hartney et al. | |
| 5,362,940 A | 11/1994 | MacDonald et al. | |
| 5,364,222 A | 11/1994 | Akimoto et al. | |
| 5,366,851 A | 11/1994 | Novembre | |
| 5,371,822 A | 12/1994 | Horwitz et al. | |
| 5,374,327 A | 12/1994 | Imahashi et al. | |
| 5,376,810 A | 12/1994 | Hoenk et al. | |
| 5,422,295 A | 6/1995 | Choi et al. | |
| 5,424,549 A | 6/1995 | Feldman | |
| 5,425,848 A | 6/1995 | Haisma et al. | |
| 5,431,777 A | 7/1995 | Austin et al. | |
| 5,434,107 A | 7/1995 | Paranjpe | |
| 5,445,195 A | 8/1995 | Kim | |
| 5,449,117 A | 9/1995 | Muderlak et al. | |
| 5,451,435 A | 9/1995 | Yu | |
| 5,453,157 A | 9/1995 | Jeng | |
| 5,458,520 A | 10/1995 | DeMercuio | |
| 5,468,542 A | 11/1995 | Crouch | |
| 5,480,047 A | 1/1996 | Tanigawa et al. | |
| 5,512,131 A | 4/1996 | Kumar et al. | |
| 5,542,605 A | 8/1996 | Campau | |
| 5,545,367 A | 8/1996 | Bae et al. | |
| 5,601,641 A | 2/1997 | Stephens | |
| 5,612,068 A | 3/1997 | Kempf et al. | |
| 5,628,917 A | 5/1997 | MacDonald et al. | |
| 5,643,364 A | 7/1997 | Zhao et al. | |
| 5,654,238 A | 8/1997 | Cronin et al. | |
| 5,669,303 A | 9/1997 | Maracas et al. | |
| 5,736,424 A | 4/1998 | Prybyla et al. | |
| 5,753,014 A | 5/1998 | Van Rijn | |
| 5,772,905 A | 6/1998 | Chou | |
| 5,776,748 A | 7/1998 | Singhvi et al. | |
| 5,804,474 A | 9/1998 | Sakaki et al. | |
| 5,812,629 A | 9/1998 | Clauser | |
| 5,817,579 A | 10/1998 | Ko et al. | |
| 5,820,769 A | 10/1998 | Chou | |
| 5,843,363 A | 12/1998 | Mitwalsky et al. | |
| 5,849,209 A | 12/1998 | Kindt-Larsen et al. | |
| 5,849,222 A | 12/1998 | Jen et al. | |
| 5,858,580 A | 1/1999 | Wang et al. | |
| 5,888,650 A | 3/1999 | Calhoun et al. | |
| 5,895,263 A | 4/1999 | Carter et al. | |
| 5,900,160 A | 5/1999 | Whitesides et al. | |
| 5,907,782 A | 5/1999 | Wu | |
| 5,926,690 A | 7/1999 | Toprac et al. | |
| 5,948,470 A | 9/1999 | Harrison et al. | |
| 5,948,570 A | 9/1999 | Kornblit et al. | |
| 5,956,216 A | 9/1999 | Chou | |
| 5,974,150 A | 10/1999 | Kaish et al. | |
| 5,983,906 A | 11/1999 | Zhao et al. | |
| 6,046,056 A | 4/2000 | Parce et al. | |
| 6,048,799 A | 4/2000 | Prybyla | |
| 6,067,144 A | 5/2000 | Murouchi | |
| 6,074,827 A | 6/2000 | Nelson et al. | |
| 6,150,680 A | 11/2000 | Eastman et al. | |
| 6,180,239 B1 | 1/2001 | Whitesides et al. | |
| 6,218,316 B1 | 4/2001 | Marsh | |
| 6,242,363 B1 | 6/2001 | Zhang | |
| 6,245,213 B1 | 6/2001 | Olsson et al. | |
| 6,258,661 B1 * | 7/2001 | Furukawa et al. | 438/249 |
| 6,274,294 B1 | 8/2001 | Hines | |
| 6,309,580 B1 | 10/2001 | Chou | |
| 6,326,627 B1 | 12/2001 | Putvinski et al. | |
| 6,329,256 B1 | 12/2001 | Ibok | |
| 6,334,960 B1 | 1/2002 | Willson et al. | |
| 6,337,262 B1 | 1/2002 | Pradeep et al. | |
| 6,348,999 B1 | 2/2002 | Summersgill et al. | |
| 6,355,198 B1 | 3/2002 | Kim et al. | |
| 6,376,379 B1 | 4/2002 | Quek et al. | |
| 6,379,573 B1 | 4/2002 | Kim et al. | |
| 6,383,928 B1 | 5/2002 | Eissa | |
| 6,387,330 B1 | 5/2002 | Bova et al. | |
| 6,387,783 B1 | 5/2002 | Furukawa et al. | |
| 6,388,253 B1 | 5/2002 | Su | |
| 6,391,217 B2 | 5/2002 | Schaffer et al. | |
| 6,391,798 B1 | 5/2002 | DeFelice et al. | |
| 6,423,207 B1 | 7/2002 | Heidari et al. | |
| 6,482,742 B1 | 11/2002 | Chou | |
| 6,495,907 B1 | 12/2002 | Jain et al. | |
| 6,498,640 B1 | 12/2002 | Ziger | |
| 6,503,829 B2 | 1/2003 | Kim et al. | |
| 6,514,672 B2 | 2/2003 | Young et al. | |
| 6,517,977 B2 | 2/2003 | Resnick et al. | |
| 6,517,995 B1 | 2/2003 | Jacobson et al. | |
| 6,518,189 B1 | 2/2003 | Chou | |
| 6,521,536 B1 | 2/2003 | Robinson | |
| 6,534,418 B1 | 3/2003 | Plat et al. | |
| 6,541,360 B1 | 4/2003 | Plat et al. | |
| 6,565,928 B2 | 5/2003 | Sakamoto et al. | |
| 6,580,172 B2 | 6/2003 | Mancini et al. | |
| 6,586,268 B1 | 7/2003 | Kopola et al. | |
| 6,593,240 B1 | 7/2003 | Page | |
| 6,621,960 B2 | 9/2003 | Wang et al. | |
| 6,623,579 B1 | 9/2003 | Smith et al. | |
| 6,627,544 B2 | 9/2003 | Izumi et al. | |
| 6,629,292 B1 | 9/2003 | Corson et al. | |
| 6,632,742 B2 | 10/2003 | Yang et al. | |
| 6,635,581 B2 | 10/2003 | Wong | |
| 6,646,662 B1 | 11/2003 | Nebashi et al. | |
| 6,665,014 B1 | 12/2003 | Assadi et al. | |

| | | |
|---|---|---|
| 6,677,252 B2 | 1/2004 | Marsh |
| 6,678,038 B2 | 1/2004 | Binnard |
| 6,696,220 B2 | 2/2004 | Bailey et al. |
| 6,713,238 B1 | 3/2004 | Chou et al. |
| 6,719,915 B2 | 4/2004 | Willson et al. |
| 6,776,094 B1 | 8/2004 | Whitesides et al. |
| 6,809,356 B2 | 10/2004 | Chou |
| 6,828,244 B2 | 12/2004 | Chou |
| 6,833,325 B2 | 12/2004 | Huang et al. |
| 6,849,558 B2 | 2/2005 | Schaper |
| 6,870,301 B2 | 3/2005 | Choi et al. |
| 6,873,087 B1 | 3/2005 | Choi et al. |
| 6,879,162 B2 | 4/2005 | Aguero et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,932,934 B2 | 8/2005 | Choi et al. |
| 6,946,360 B2 | 9/2005 | Chou |
| 6,955,767 B2 | 10/2005 | Chen |
| 6,964,793 B2 | 11/2005 | Willson et al. |
| 6,994,808 B2 | 2/2006 | Lee et al. |
| 7,029,944 B1 * | 4/2006 | Conley et al. ............ 438/69 |
| 7,071,088 B2 | 7/2006 | Watts et al. |
| 7,077,992 B2 | 7/2006 | Sreenivasan et al. |
| 7,105,452 B2 | 9/2006 | Sreenivasan |
| 7,117,583 B2 | 10/2006 | Dinan et al. |
| 7,128,875 B2 | 10/2006 | Cubicciotti |
| 7,214,624 B2 | 5/2007 | Fujita et al. |
| 7,244,386 B2 | 7/2007 | Sreenivasan et al. |
| 2001/0023829 A1 | 9/2001 | Olsson et al. |
| 2002/0038916 A1 | 4/2002 | Chiu et al. |
| 2002/0042027 A1 | 4/2002 | Chou et al. |
| 2002/0094496 A1 | 7/2002 | Choi et al. |
| 2002/0110992 A1 | 8/2002 | Ho |
| 2002/0111036 A1 | 8/2002 | Zhu et al. |
| 2002/0132482 A1 | 9/2002 | Chou |
| 2002/0167117 A1 | 11/2002 | Chou |
| 2002/0168578 A1 | 11/2002 | Wang et al. |
| 2002/0170880 A1 | 11/2002 | Chen |
| 2002/0191141 A1 | 12/2002 | Liao |
| 2003/0025895 A1 | 2/2003 | Binnard |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0129542 A1 | 7/2003 | Shih et al. |
| 2003/0137494 A1 | 7/2003 | Tulbert |
| 2003/0151714 A1 | 8/2003 | Takahashi et al. |
| 2003/0174435 A1 | 9/2003 | Dinan et al. |
| 2003/0179354 A1 | 9/2003 | Araki et al. |
| 2003/0184917 A1 | 10/2003 | Chang et al. |
| 2003/0186140 A1 | 10/2003 | Fries |
| 2003/0197312 A1 | 10/2003 | Hougham et al. |
| 2003/0224116 A1 | 12/2003 | Chen et al. |
| 2004/0029041 A1 | 2/2004 | Shih et al. |
| 2004/0036201 A1 | 2/2004 | Chou et al. |
| 2004/0046288 A1 | 3/2004 | Chou |
| 2004/0065252 A1 | 4/2004 | Sreenivasan et al. |
| 2004/0065976 A1 | 4/2004 | Sreenivasan et al. |
| 2004/0095656 A1 | 5/2004 | Lee et al. |
| 2004/0110856 A1 | 6/2004 | Young et al. |
| 2004/0118809 A1 | 6/2004 | Chou et al. |
| 2004/0131718 A1 | 7/2004 | Chou et al. |
| 2004/0137734 A1 | 7/2004 | Chou et al. |
| 2004/0146792 A1 | 7/2004 | Nimmakayala et al. |
| 2004/0156108 A1 | 8/2004 | Chou et al. |
| 2004/0192041 A1 | 9/2004 | Jeong et al. |
| 2004/0197843 A1 | 10/2004 | Chou et al. |
| 2004/0201890 A1 | 10/2004 | Crosby |
| 2004/0250945 A1 | 12/2004 | Zheng et al. |
| 2005/0037143 A1 | 2/2005 | Chou et al. |
| 2005/0056963 A1 | 3/2005 | McCutcheon |
| 2005/0284886 A1 | 12/2005 | Penciu |
| 2006/0017876 A1 | 1/2006 | Watts |
| 2006/0049455 A1 * | 3/2006 | Jang et al. ............ 257/330 |
| 2006/0062867 A1 | 3/2006 | Choi et al. |
| 2006/0076717 A1 | 4/2006 | Sreenivasan et al. |
| 2006/0077374 A1 | 4/2006 | Sreenivasan et al. |
| 2006/0113697 A1 | 6/2006 | Sreenivasan |
| 2006/0114558 A1 * | 6/2006 | Shimizu ............ 359/457 |
| 2007/0126150 A1 | 6/2007 | GanapathiSubramanian et al. |
| 2007/0132152 A1 | 6/2007 | Choi et al. |
| 2007/0170617 A1 | 7/2007 | Choi et al. |
| 2007/0228609 A1 | 10/2007 | Sreenivasan et al. |
| 2007/0228610 A1 | 10/2007 | Sreenivasan et al. |
| 2007/0231981 A1 | 10/2007 | Sreenivasan et al. |

FOREIGN PATENT DOCUMENTS

| | | |
|---|---|---|
| FR | 2677043 A1 | 12/1992 |
| JP | 3-32888 | 2/1981 |
| JP | 1-196749 | 8/1989 |
| JP | 02-24848 | 1/1990 |
| JP | 02-92603 | 4/1990 |
| JP | 02192045 | 7/1990 |
| JP | 4-70379 | 5/1992 |
| JP | 58-129074 | 8/1993 |
| WO | WO 87/02935 | 5/1987 |
| WO | WO 98/10121 | 3/1998 |
| WO | WO 99/05724 | 2/1999 |
| WO | WO 99/45753 | 9/1999 |
| WO | WO 00/21689 | 4/2000 |
| WO | WO 01/47003 | 6/2001 |
| WO | WO 01/63361 | 8/2001 |
| WO | WO 01/69317 | 9/2001 |
| WO | WO 01/79589 | 10/2001 |
| WO | WO 01/79933 | 10/2001 |
| WO | WO 02/22916 | 3/2002 |
| WO | WO 02/24977 | 3/2002 |

OTHER PUBLICATIONS

Tsukamoto et al "High Sensitivity Pixel Technology for a 1/4 inch PAL 430k pixel IT-CCD," Jan. 1, 1996, IEE Custom Integrated Circuits Conference.

Thompson et al "Fabrication of Step and Flash Imprint Lithography Templates Using Commercial Mask Processes," Feb. 1, 2003 SPIE Microlithography Conference USA.

Choi et al "Layer-to-Layer Alignment for Step and Flash Imprint Lithography," Mar. 1, 2001, SPIE's 26th Intl. Symp. Microlithography: Emerging Lithographic Technologies, Santa Clara, CA USA.

Choi et al "Distortion and Overlay Performance of UV Step and Repeat Imprint Lithography," Sep. 1, 2004 MNE Micro-and Nano-Engineering Conference.

Johnson et al., Advances in Step and Flash Imprint Lithography, SPIE Microlithograpy Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Wu, Large Area High Density Quantized Magnetic Disks Fabricated Using Nanoimprint Lithography, J. Vac. Sci. Technol. B 16(6), pp. 3825-3829 Nov. 1, 1998.

Gokan et al., Dry Etch Resistance of Organic Materials, J. Electrochem. Soc.: Solid-State Science and Technology, pp. 143-146 Jan. 1, 1983.

Chou, Nanoimprint Lithography and Lithographically Induced Self-Assembly, MRS Bulletin, pp. 512-517 Jul. 1, 2001.

Braeuer et al., Precise Polymer Micro-Optical Systems, MRS Bulletin, pp. 519-522 Jul. 1, 2001.

Choi et al., Design of Orientation Stages for Step and Flash Imprint Lithography, Precision Engineering, pp. 192-199 Jan. 1, 2001.

Ruchhoeft et al., Patterning Curved Surfaces: Template Generation by Ion Beam Proximity Lithography and Relief Transfer by Step and Flash Imprint Lithography, Journal of Vacuum Science and Technology, pp. 1-17 Jan. 1, 2000.

Xia et al., Soft Lithography, Angew. Chem. Int. Ed., pp. 550-575 Jan. 1, 1998.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Xia et al., Soft Lithography, Annu Rev. Mater Sci. 1998 28: 153-184 Jan. 1, 1998.

Chou et al., Imprint of Sub-25 nm Vias and Trenches in Polymers, Appl. Phys. Lett. 67 (21) Nov. 20, 1995.

Otto et al., Characterization and Application of a UV-based Imprint Technique, Microelectronic Engineering 57-58, pp. 361-366 Jan. 1, 2001.

Nguyen, Asymmetric Fluid-Structure Dynamics in Nanoscale Imprint Lithography, The University of Texas at Austin, pp. 1-111 Aug. 1, 2001.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. Vac. Sci. Technol. B 18(6), pp. 3557-3560 Nov. 1, 2000.

Abstract of Japanese Patent 02-92603, Aug. 12, 2004.

Translation of Japanese Patent 02-92603, Apr. 3, 1990.

Translation of Japanese Patent 02-24848, Jan. 26, 1990.

Abstract of Japanese Patent 02-24848, Jan. 26, 1990.

Otto et al., Reproducibility and Homogeneity in Step and Repeat UV-Nanoimprint Lithography, Microelectronic Engineering 73-74, pp. 152-156 Jan. 1, 2004.

Kawata et al., Imprint/Photo Hybrid Litography Using Conventional Contact Aligner, Janpanese Journal of Applied Physics, vol. 43, No.6B, pp. 4027-4030 Jun. 29, 2004.

Kim et al., Reducing Photocurable Polymer Pattern Shrinkage and Roughness during Dry Etching in Photo-Nanoimprint Litography, Japanese Journal of Applied Physics, vol. 43, No. 6B, pp. 4022-4026 Jun. 29, 2004.

Abstract of Japanese Patent 58-129074, Aug. 1, 1983.

Chou et al., Ultrafast and Direct Imprint of Nanostructures in Silicon, Nature, Col. 417, (Jun. 2002), pp. 835-837 Jun. 1, 2002.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol. b. 19(6) Nov. 1, 2001.

Wilson et al., Lithography and Etch Issues, Handbook of Multilevel Metallization for Integrated Circuits, pp. 566-567 Jan. 1, 1993.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Schneider et al., Stripes of Partially Fluorinated Alkyl Chains: Dipolar Langmuir Monolayers, J. Chem. Phys. vol. 122, Issue 9 Mar. 1, 2005.

Park et al., Aligning Liquid Crystals Using Replicated Nanopatterns, PSI Scientific Report 2002, vol. VII, p. 85 Mar. 1, 2003.

McMackin et al., Design and Performance of a Step and Repeat Imprinting Machine, SPIE Microltihgraphy Conference Feb. 1, 2003.

Le et al., Development of an Etch-Definable Lift-Off Process for Use with Step and Flash Imprint Lithography, SPIE Microlithography Conference Feb. 1, 2005.

Cardinale et al., Fabrication of a Surface Acoustic Wave-Based Correlator Using Step-and-Flash Imprint Lithography, J. Vac. Sci. Technol. B 22(6) Nov. 1, 2004.

Abstract of Japanese Patent 3-32888, Feb. 13, 1991.

Abstract of French Patent 2677043, Dec. 1, 1992.

Colburn et al., Dissertation for the Degree of Doctor of Philosophy, Step and Flash Imprint Lithography: A Low-Pressure, Room-Temperature Nanoimprint Lithography Aug. 1, 2001.

Thurn et al., Stress Hysteresis and Mechanical Properties of Plasma-Enhanced Chemical Vapor Deposited Dielectric Films, Journal of Applied Physics, vol. 95, No. 3, pp. 967-976 Feb. 1, 2004.

Modreanu et al., Optical Properties of LPCVD Silicon Oxynitride, Thin Solid Films 337, pp. 82-84.

Casey et al., Control of Metal Deposition in a Web Coater, Controlling in both Transverse and Machine Direction, Proceedings, Annual Technical Conference - Society of Vacuum Coaters May 4, 1990.

Lu et al., The Effect of Deposition Parameters on Performance of VME-FPC, Proceedings of the IEEE International Vacuum Microelectronics Conference, IVMC Aug. 16, 2001.

Abstract of Japanese patent 02-192045, Jul. 27, 1990.

PCT/US07/08433 International Search Report, Aug. 13, 2008.

* cited by examiner

SELF-ALIGNED PROCESS FOR FABRICATING IMPRINT TEMPLATES CONTAINING VARIOUSLY ETCHED FEATURES

This application claims priority to U.S. Provisional Patent Application Ser. No. 60/792,750, which is hereby incorporated by reference herein.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention and all of which are incorporated by reference herein.

The imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. A template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

DETAILED DESCRIPTION

The present invention comprises a process that enables coplanarization of the structures that have been created in multiple independent etch steps. The various etches are performed independently by selectively exposing only certain patterns to particular etching conditions. After these structures have been created, it is possible that the various structures will exist at different planes/elevations relative to the template surface. At this point, the elevations of the various structures are adjusted independently by selectively exposing "higher" structures to an anisotropic etch that reduces the overall elevation of the structures, while preserving the structural topography. These and other embodiments are described more fully below.

Figure 1:
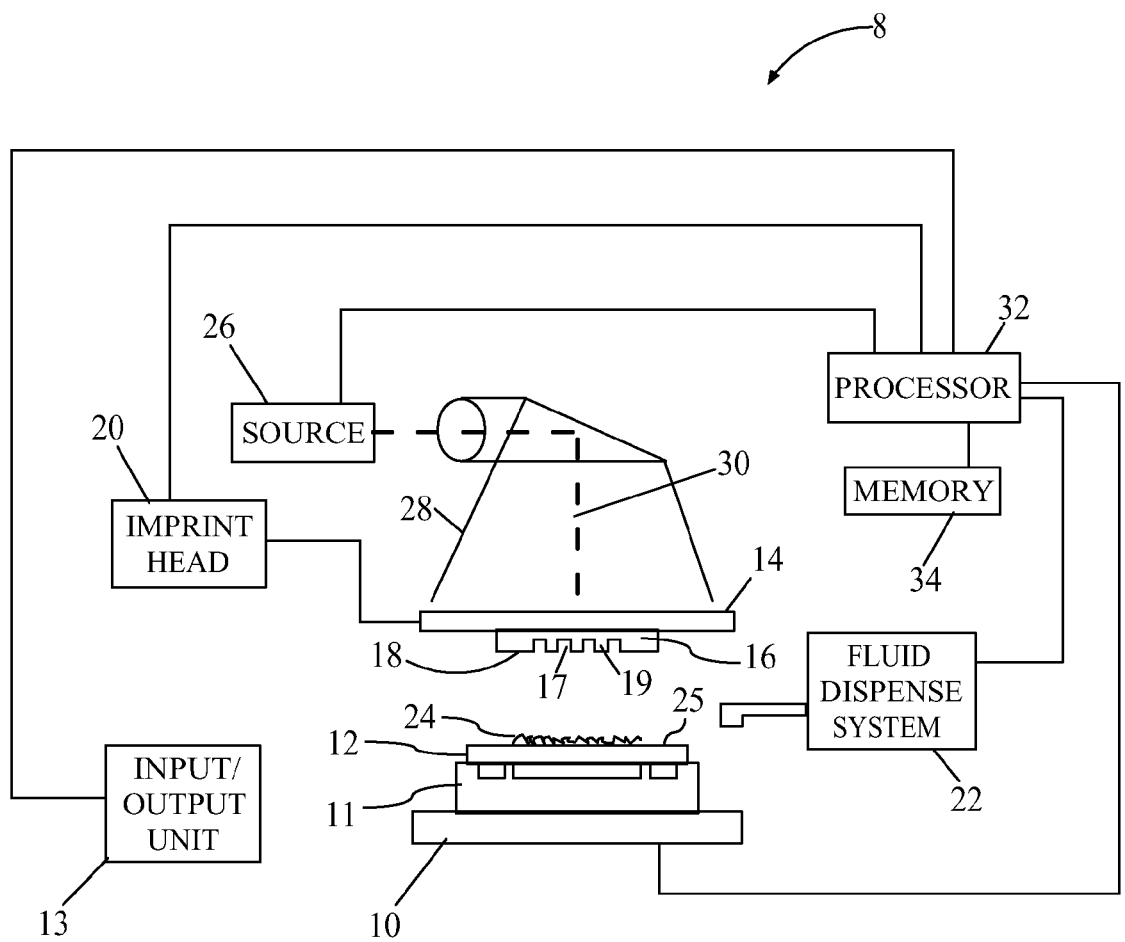
FIG. 1 is a simplified side view of a lithographic system having a template spaced-apart from a substrate.

Referring to FIG. 1, a system 8 to form a relief pattern on a substrate 12 includes a stage 10 upon which substrate 12 is supported and a template 14, having a patterning surface 18 thereon. In a further embodiment, substrate 12 may be coupled to a substrate chuck (not shown), the substrate chuck (not shown) being any chuck including, but not limited to, vacuum and electromagnetic.

Template 14 and/or mold 16 may be formed from materials including, but not limited to, fused-silica, quartz, silicon, organic polymers, siloxane polymers, borosilicate glass, fluorocarbon polymers, metal, and hardened sapphire. As shown, patterning surface 18 comprises features defined by a plurality of spaced-apart recesses 17 and protrusions 19. However, in a further embodiment, patterning surface 18 may be substantially smooth and/or planar. Patterning surface 18 may define an original pattern that forms the basis of a pattern to be formed on substrate 12.

Template 14 may be coupled to an imprint head 20 to facilitate movement of template 14, and therefore, mold 16. In a further embodiment, template 14 may be coupled to a template chuck (not shown), the template chuck (not shown) being any chuck including, but not limited to, vacuum and electromagnetic. A fluid dispense system 22 is coupled to be selectively placed in fluid communication with substrate 12 so as to deposit polymeric material 24 thereon. It should be understood that polymeric material 24 may be deposited using any known technique, e.g., drop dispense, spin-coating, dip coating, chemical vapor deposition (CVD), physical vapor deposition (PVD), and the like.

A source 26 of energy 28 is coupled to direct energy 28 along a path 30. Imprint head 20 and stage 10 are configured to arrange mold 16 and substrate 12, respectively, to be in superimposition and disposed in path 30. Either imprint head 20, stage 10, or both vary a distance between mold 16 and substrate 12 to define a desired volume therebetween that is filled by polymeric material 24.

Referring to FIG. 1, typically, polymeric material 24 is disposed upon substrate 12 before the desired volume is defined between mold 16 and substrate 12. However, polymeric material 24 may fill the volume after the desired volume has been obtained. After the desired volume is filled with polymeric material 24, source 26 produces energy 28, e.g., broadband energy that causes polymeric material 24 to solidify and/or cross-link conforming to the shape of a surface 25 of substrate 12 and patterning surface 18, defining a patterned layer 50 on substrate 12.

The broadband energy may comprise an actinic component including, but not limited to, ultraviolet wavelengths, thermal energy, electromagnetic energy, visible light and the like. The actinic component employed is known to one skilled in the art and typically depends on the material from which imprinting layer 12 is formed. Control of this process may be regulated by a processor 32 that is in data communication with stage 10, imprint head 20, fluid dispense system 22, source 26, operating on a computer readable program stored in memory 34.

The above-mentioned may be further employed in imprint lithography processes and systems referred to in U.S. Pat. No. 6,932,934 entitled "Formation of Discontinuous Films During an Imprint Lithography Process;" United States patent application publication 2004/0124566, filed as U.S. patent application Ser. No. 10/194,991 entitled "Step and Repeat Imprint Lithography Processes;" and United States patent application publication 2004/0188381, filed as U.S. patent application Ser. No. 10/396,615, entitled "Positive Tone Bi-Layer Imprint Lithography Method"; and United States patent application publication 2004/0211754, filed as U.S. patent application Ser. No. 10/432,642, entitled "Method of Forming Stepped Structures Employing Imprint Lithography," all of which are incorporated by reference herein.

A template often used for the above-mentioned method of patterning a substrate is fused silica, and features often defined in this template comprise a so-called binary relief structure. Such structures, which are used widely in semiconductor processing, diffractive optics, etc., are prepared by well known techniques employed by the photomask industry, involving anisotropic dry etching of exposed fused silica using chromium to mask or protect areas that are not to be etched.

While the above-mentioned method may be desired for the fabrication of a binary relief image, there is growing interest in the use of nanoimprinting for the fabrication of continuous tone relief images, such as those required by refractive optical elements. An example of a commercially relevant need for such elements is in the imaging sensor area where arrays of such elements ("lenslet" arrays) are used to gather light and increase sensor sensitivity.

Figure 2:
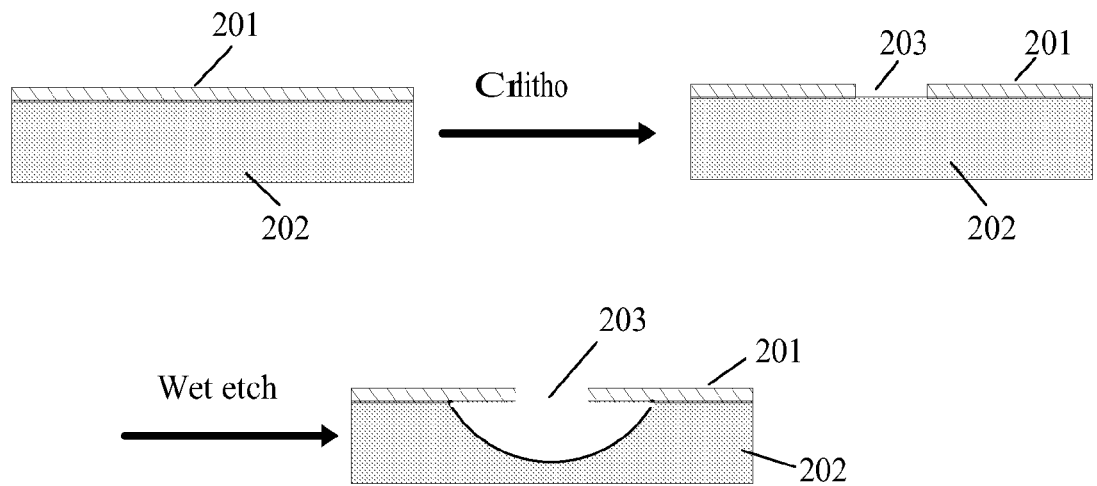
FIG. 2 illustrates a method of patterning a substrate in accordance with the prior art.

While several methodologies exist in principal to fabricate continuous tone structures in fused silica, many are complex in their execution, requiring careful process control in order to be able to deliver the required structures. In contrast, isotropic etching, which is commonly achieved through so-called wet etching, naturally provides a continuous tone etch that lends itself to the fabrication of refractive optics. In isotropic etching, the etch rate at all surfaces is equal in rate in all directions. FIG. 2 shows how this can be made to make a lenslet. A layer of etch mask, 201, is patterned so that a small area, 203, of substrate body, 202, can be exposed to the etching chemistry. When the opening 203 is a small circle, isotropic wet-etching processes can produce a spherical lenslet.

It may be apparent in this process there is a fundamental restriction in wet etching; since the etch depth will be the same as the lateral etch extent in either direction, the lens shape is constrained by the following equation:

$$\text{Lens depth} = 0.5 \times (\text{lens width} - \text{hole width})$$

This means that the lens may not be deeper than half its width (even with no hole to etch through). However, it is very possible that for some applications lenses will be required where the lens depth needs to be greater than is achievable by the method described.

Figure 3:
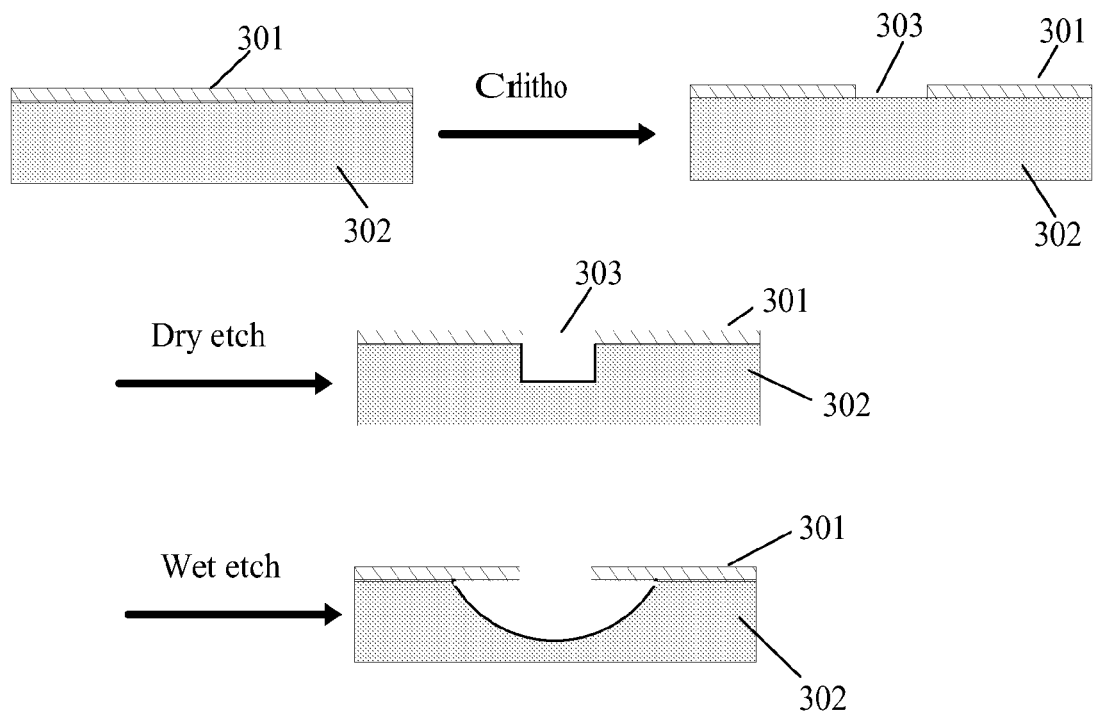
FIG. 3 illustrates a method of patterning a substrate in accordance with the present invention.

Referring to FIG. 3, there is illustrated a schematic of a methodology that describes a combined use of anisotropic dry etching and isotropic wet etching to produce features unobtainable by wet etching alone.

The mask protecting material 301 to be etched is exposed through lithography. In the case of fused silica 302, chromium is typically used for this mask 301. The exposed area may be a round hole 303, although this need not be necessarily the case.

Next, an anisotropic dry etch is used to generate a trench through the hole 303. The depth of this etch will increase the overall lenslet aspect ratio which is generated in the next, wet etch. A next step of the process involves removal of the chromium layer, although there may be other process steps required that relate to other aspects of fabricating the template that could be inserted into this process.

By using the above procedure, wet etching can be used to create refractive elements with much greater control than is afforded by the use of wet etching alone. The simplicity of this technique compared with other methods for generating continuous tone lenses makes this approach very attractive, and while there are still restrictions placed on the lens design using this methodology, this technology is very well suited for delivering lenslet arrays of the kind required for imaging sensors and the like, where precise optical lens shape requirements are somewhat relaxed.

Furthermore, herein described is a process for creating an imprint template containing various topological structures that are created in multiple etch steps, which might be mutually incompatible. Some or all of these structures are patterned into a hard mask material (e.g., chromium) in a single lithography step to achieve best registration among the structure types; the various structure types are thus "self-aligned." The various structures are then etched independently and sequentially by selectively masking off the regions (e.g., with photoresist) that are not to be etched during a particular step. For example, one etch step might be a dry etch to create alignment structures, and a subsequent etch might consist of wet etching to create three-dimensional structures. These steps are mutually incompatible because a wet etch will degrade the alignment structures, and vice versa. After these different etch steps, the various structures might exist at different heights above the surface of the template. It is then possible to selectively reduce the height of the higher features by an anisotropic dry etch that substantially preserves the structures while reducing their elevation relative to other structures on the template surface.

Creation of topography on an imprint template typically occurs by first transferring a pattern in a photoresist material into a thin "hard mask" layer, e.g., chromium. The hard mask pattern may then be transferred into the underlying template material (e.g., fused silica) by etching. Depending on the geometry of the desired template topography, a fused silica etching step may be one of several types of wet (liquid) or dry (plasma) etching processes. In general, different types of etching steps are mutually incompatible: an etch step that works well to create one type of structure will generally degrade other types of structures. It is possible to perform multiple lithography steps to protect/mask certain structures and expose other structures at the various etch steps; however, the resulting structures will not necessarily be coplanar at the end of this iterative process because the various etch steps might etch to different depths. However, it is often necessary for the structures to exist at the same plane to enable imprinting with a uniform and/or thin residual layer, described further below.

Figure 4A:
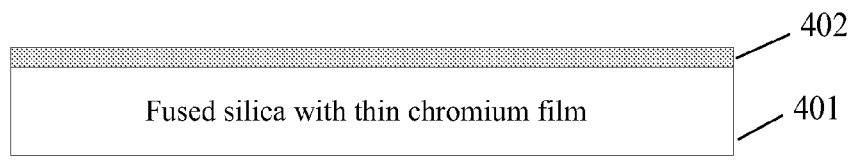
FIGS. 4a-4n illustrate a process flow for creating variously etched features on an imprint template.
Figure 4B:
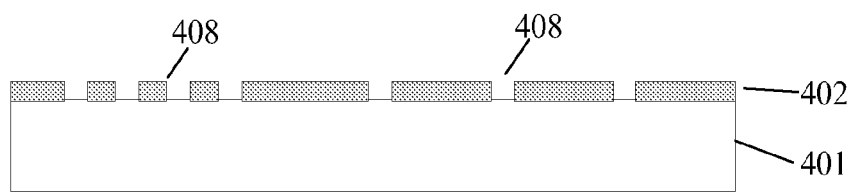
Figure 4C:
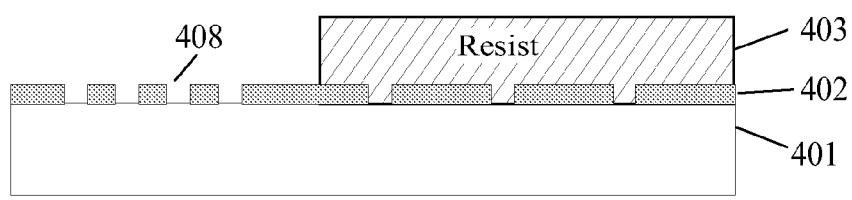
Figure 4D:
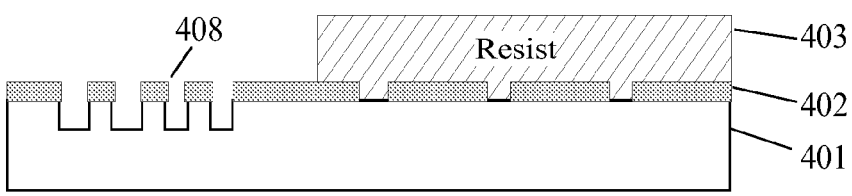
Figure 4E:
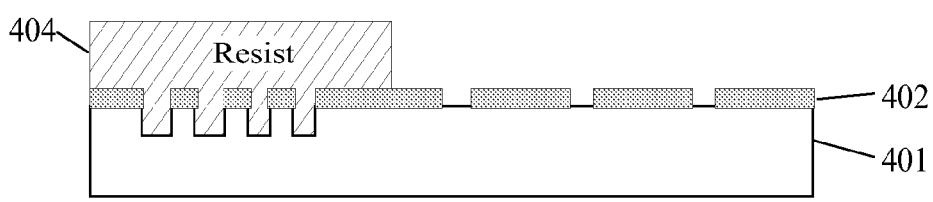
Figure 4F:
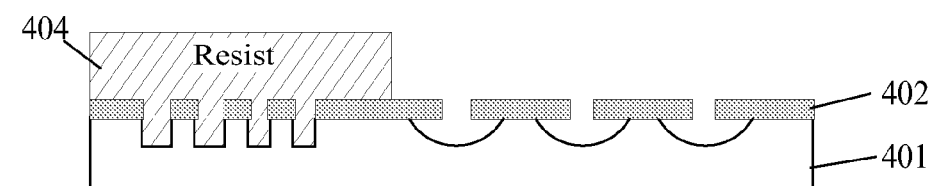
Figure 4G:
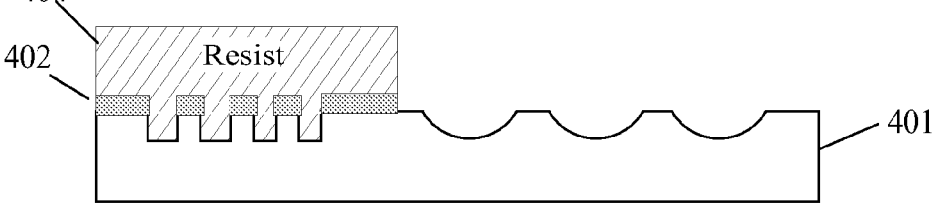
Figure 4H:
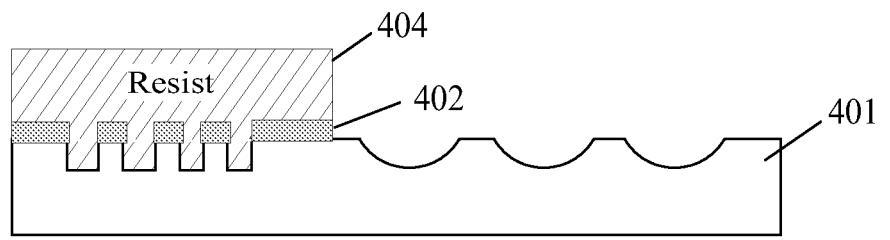
Figure 4I:
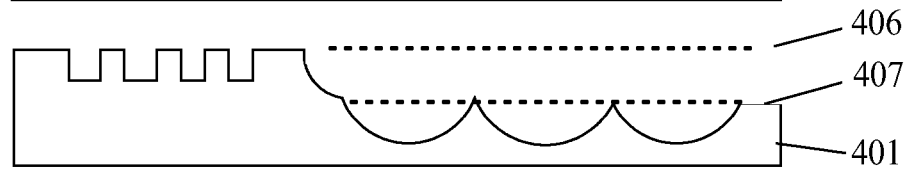
Figure 4J:
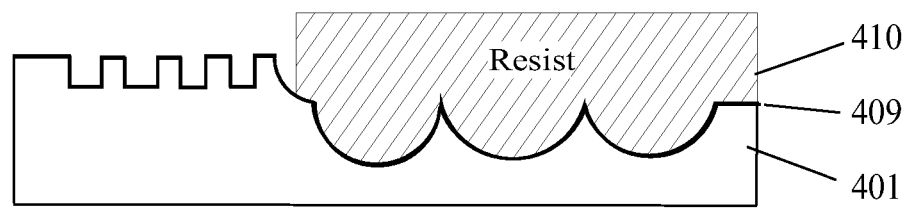
Figure 4K:
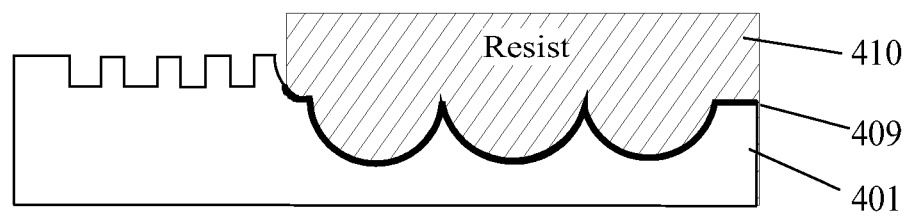
Figure 4L:
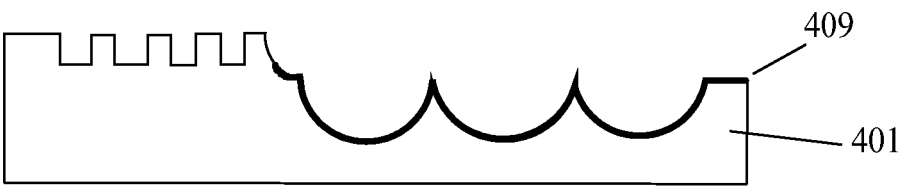
Figure 4M:
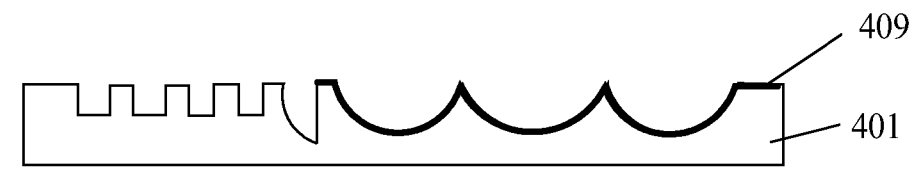
Figure 4N:

FIGS. 4a through 4n illustrate a process in accordance with an embodiment of the present invention.

Referring to FIG. 4a, a standard fused silica photomask blank 401 with a thin layer of chromium 402 is provided.

Referring to FIG. 4b, patterns 408 are created in the chromium layer 402 to define multiple structure types in a single lithography step.

Referring to FIG. 4c, certain chromium patterns 408 are masked, e.g., with resist 403.

Referring to FIG. 4d, the unmasked chromium features 408 are etch transferred into fused silica with an appropriate etch process, e.g., a reactive ion plasma etching process.

Referring to FIG. 4e, the resist 403 from the previous step illustrated in FIG. 4d is removed and the substrate is cleaned. The step associated with FIG. 4c is repeated to expose unetched chromium patterns. Photoresist 404 is deposited to mask the previously unmasked features.

Referring to FIG. 4f, an etch transfer exposes the chromium patterns now unmasked into the underlying quartz substrate 401, e.g., with a wet etch process.

Referring to FIG. 4g, additional etch processing may be performed as needed to created a desired topography, e.g., wet strip the chromium 402 in exposed regions.

Referring to FIG. 4h, additional etch processing may be performed as needed to created a desired topography, e.g., a second wet etch of the fused silica 401.

Referring to FIG. 4i, the resist 404 and chromium 402 may be removed as needed. At this point, the template 401 contains desired local structures, but the structures exist at different planes 406, 407 of elevation across the template 401.

Referring to FIG. 4j, the substrate 401 may be coated with another thin layer of chromium 409, and the structures that exist at a lower plane 407 of elevation may be masked, e.g., with resist 410.

Referring to FIG. 4k, the chromium 409 is etched from the unmasked portion of the substrate 401.

Referring to FIG. 4l, the resist 410 is removed at this point to improve the performance of the subsequent etch process, as needed.

Referring to FIG. 4m, the exposed structures at the higher plane 406 of elevation may be anisotropically etched downward to a lower plane of elevation (e.g., plane 407) which might be substantially coplanar with other structures.

Referring to FIG. 4n, the chromium 409 is removed to yield the final structure.

Embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalent.

The invention claimed is:

1. A method of processing a substrate to fabricate a microlens imprint template comprising:
    overlaying the substrate with a mask having a plurality of through apertures;
    applying a resist to a first portion of the apertures leaving a second portion of the apertures unmasked;
    performing an anisotropic dry etch of the substrate through the second portion of unmasked apertures thereby forming first features in the substrate;
    removing the resist on the first portion of the apertures and applying a resist over the first features;
    performing a first isotropic wet etch of the substrate through the first portion of the apertures in the mask thereby forming second features as microlens hemispheres in the substrate;
    removing the mask from over the second features; and,
    performing a second isotropic etch to the second features to change an aspect ratio of the microlens hemispheres.

2. The method as recited in claim 1, wherein the substrate comprises fused silica.

3. The method as recited in claim 1, wherein the second isotropic wet etch increases a diameter of at least one microlens hemisphere.

4. The method as recited in claim 1 wherein the second isotropic wet etch increases a diameter of at least one microlens hemisphere so that it touches a neighboring microlens hemisphere thereby enhancing the shape of the microlens.

5. The method as recited in claim 4 wherein the second isotropic wet etch is performed until there is no separation between microlens hemispheres in the substrate.

6. The method of claim 1 further comprising removing the resist and mask over the first features thereby exposing the first and second features in the substrate.

7. The method of claim 6, wherein the first features are used as locating features for the microlens imprint template.

* * * * *